(12) United States Patent
Lin et al.

(10) Patent No.: US 8,618,660 B2
(45) Date of Patent: Dec. 31, 2013

(54) INTEGRATED CIRCUIT DEVICE

(75) Inventors: Tai-Hung Lin, Hsinchu (TW); Chang-Tien Tsai, Hsinchu (TW)

(73) Assignee: Novatek Microelectronics Corp., Hsinchu (TW)

(*) Notice: Subject to any disclaimer, the term of this patent is extended or adjusted under 35 U.S.C. 154(b) by 0 days.

(21) Appl. No.: 13/423,264

(22) Filed: Mar. 18, 2012

(65) Prior Publication Data

US 2012/0248606 A1  Oct. 4, 2012

(30) Foreign Application Priority Data

Mar. 31, 2011  (TW) .............................. 100111301 A

(51) Int. Cl.
*H01L 23/49* (2006.01)

(52) U.S. Cl.
USPC ........................................................ 257/741

(58) Field of Classification Search
USPC ........ 361/720, 721, 736–743, 748–804, 91.1, 361/91.5, 91.6; 257/355–363, 773–774, 257/776, 741
See application file for complete search history.

(56) References Cited

U.S. PATENT DOCUMENTS

| | | | |
|---|---|---|---|
| 5,828,078 A * | 10/1998 | Doudoumopoulos | 257/30 |
| 6,576,970 B2 * | 6/2003 | Kim | 257/459 |
| 6,680,838 B2 * | 1/2004 | Tang et al. | 361/111 |
| 6,696,730 B2 * | 2/2004 | Kawazoe et al. | 257/355 |
| 6,940,093 B2 * | 9/2005 | Eldridge et al. | 257/48 |
| 7,582,937 B2 * | 9/2009 | Lai | 257/355 |
| 7,989,954 B2 * | 8/2011 | Lin et al. | 257/758 |
| 8,004,083 B2 * | 8/2011 | Lin et al. | 257/758 |
| 8,232,192 B2 * | 7/2012 | Lin et al. | 438/612 |
| 8,247,841 B2 * | 8/2012 | Saiki et al. | 257/173 |
| 8,344,524 B2 * | 1/2013 | Chou et al. | 257/784 |
| 2004/0212015 A1 * | 10/2004 | Huang et al. | 257/355 |
| 2004/0256675 A1 * | 12/2004 | McNeil | 257/355 |
| 2005/0093176 A1 * | 5/2005 | Hung et al. | 257/786 |
| 2005/0139987 A1 * | 6/2005 | Okada et al. | 257/700 |
| 2006/0231896 A1 * | 10/2006 | Ker et al. | 257/355 |
| 2006/0246703 A1 * | 11/2006 | Daubenspeck et al. | 438/612 |
| 2006/0250139 A1 * | 11/2006 | Perry | 324/537 |
| 2007/0096214 A1 * | 5/2007 | Chen et al. | 257/355 |
| 2007/0132029 A1 * | 6/2007 | Mitra et al. | 257/355 |
| 2007/0215948 A1 * | 9/2007 | Yang | 257/355 |
| 2007/0235808 A1 * | 10/2007 | Chang et al. | 257/355 |
| 2008/0132053 A1 * | 6/2008 | Wu et al. | 438/612 |
| 2008/0197491 A1 * | 8/2008 | Matsui | 257/737 |
| 2008/0211112 A1 * | 9/2008 | Wyland | 257/781 |
| 2008/0246152 A1 * | 10/2008 | Liu et al. | 257/758 |
| 2008/0290493 A1 * | 11/2008 | Tsunozaki | 257/686 |
| 2009/0124073 A1 * | 5/2009 | Liu et al. | 438/612 |

(Continued)

*Primary Examiner* — Thao Le
(74) *Attorney, Agent, or Firm* — Jianq Chyun IP Office

(57) ABSTRACT

An integrated circuit device including a substrate, a first internal bonding pad, a second internal bonding pad, an external bonding pad and a bonding wire is provided. A first circuit, a second circuit, at least one interconnect line and an electrostatic discharge protection circuit are embedded in the substrate. The first internal bonding pad is disposed on a surface of the substrate and electrically connected to the first circuit. The second internal bonding pad is disposed on the surface of the substrate and electrically connected to the second circuit. The first internal bonding pad is electrically connected to the second internal bonding pad via the bonding wire. The first internal bonding pad is electrically connected to the electrostatic discharge protection circuit via the interconnect line. The electrostatic discharge protection circuit is electrically connected to the external bonding pad which is used for electrically connecting an external package lead.

14 Claims, 5 Drawing Sheets

(56) References Cited

U.S. PATENT DOCUMENTS

| | | | |
|---|---|---|---|
| 2009/0290271 A1* | 11/2009 | Yang et al. | 361/56 |
| 2010/0072588 A1* | 3/2010 | Yang | 257/676 |
| 2010/0109053 A1* | 5/2010 | Jan et al. | 257/203 |
| 2010/0133701 A1* | 6/2010 | Saiki et al. | 257/774 |
| 2010/0155947 A1* | 6/2010 | Pang et al. | 257/741 |
| 2010/0301474 A1* | 12/2010 | Yang | 257/737 |
| 2011/0079912 A1* | 4/2011 | Marcoux | 257/773 |
| 2011/0080713 A1* | 4/2011 | Sunohara | 361/760 |
| 2011/0089555 A1* | 4/2011 | Shau | 257/690 |
| 2011/0121345 A1* | 5/2011 | Andrews et al. | 257/98 |
| 2011/0133337 A1* | 6/2011 | Shau | 257/738 |
| 2011/0242782 A1* | 10/2011 | Wang | 361/783 |
| 2011/0256714 A1* | 10/2011 | Yang | 438/652 |
| 2012/0007254 A1* | 1/2012 | Yang | 257/774 |

* cited by examiner

INTEGRATED CIRCUIT DEVICE

CROSS-REFERENCE TO RELATED APPLICATION

This application claims the priority benefit of Taiwan application serial no. 100111301, filed on Mar. 31, 2011. The entirety of the above-mentioned patent application is hereby incorporated by reference herein and made a part of this specification.

BACKGROUND OF THE INVENTION

1. Field of the Invention

The present invention relates to an integrated circuit device. More particularly, the present invention relates to an integrated circuit device in which portion of the interconnect lines are replaced by bonding wires.

2. Description of Related Art

Metallic interconnect is commonly used for internal electrical transmission of the integrated circuit device, wherein the connection way and the connection path is through the design conducted by the integrated circuit design program. Since the metallic interconnect is fabricated by photolithographic and etching process, all the configuration, length and width will be affected by the limitation of technology of process, and thus the electrical performance of the connection is also limited. On the other hand, wire bonding technique is commonly used to perform the electrical transmission between the terminal of the external device and the integrated circuit device. The wire bonding technique is using the metal wire produced by wire bonding process for connection. It provides a better electrical performance, and limitation to design is also reduced so as to be more flexible in design.

SUMMARY OF THE INVENTION

The present invention provides an integrated circuit device having a better electrical performance and electrostatic discharge protection.

The integrated circuit device of present invention includes a substrate, a first internal bonding pad, a second internal bonding pad, an external bonding pad and a bonding wire. A first circuit, a second circuit, at least one interconnect line and an electrostatic discharge protection circuit are embedded in the substrate. The first internal bonding pad is disposed on a surface of the substrate and electrically connected to the first circuit. The second internal bonding pad is disposed on the surface of the substrate and electrically connected to the second circuit. The external bonding pad is disposed on the surface of the substrate. The first internal bonding pad is electrically connected to the second internal bonding pad through the bonding wire. The first internal bonding pad is electrically connected to the electrostatic discharge protection circuit through the interconnect line. The electrostatic discharge protection circuit is electrically connected to the external bonding pad. The external bonding pad is used for electrically connecting to an external package lead.

In an embodiment of the present invention, the first circuit is a logic circuit, a digital circuit or a memory circuit.

In an embodiment of the present invention, the second circuit is a logic circuit, a digital circuit or a memory circuit.

In an embodiment of the present invention, the first internal bonding pad includes a first metal pad, a second metal pad and a dielectric layer, the first metal pad is electrically connected to the second metal pad, the dielectric layer is located between the first metal pad and the second metal pad. In addition, the first metal pad for example, has a wire bonding area and a conductive area, the first internal bonding pad further comprises a plurality of conductive elements passing through the dielectric layer and connecting the conductive layer to the second metal pad. Moreover, the conductive area is located at a side of the wire bonding area, for example. The conductive area is surrounding the wire bonding area. Furthermore, the second metal layer has a plurality of openings located below the wire bonding area. In addition, the material of the first metal pad and the second metal pad is copper, for example. In addition, the material of the first metal pad and the second metal pad is copper, for example.

In an embodiment of the present invention, the second internal bonding pad includes a first metal pad, a second metal pad and a dielectric layer, the first metal pad is electrically connected to the second metal pad, the dielectric layer is located between the first metal pad and the second metal pad.

In an embodiment of the present invention, the external bonding pad includes a first metal pad, a second metal pad and a dielectric layer, the first metal pad is electrically connected to the second metal pad, the dielectric layer is located between the first metal pad and the second metal pad.

In an embodiment of the present invention, the surface of the substrate has a non-circuit area surrounding the external bonding pad. The distance between the external periphery of the non-circuit area and the external periphery of the external bonding pad is 2 μm to 50 μm. The preferable distance between the external periphery of the non-circuit area and the external periphery of the external bonding pad is 10 μm.

In light of the foregoing, in the integrated circuit device of present invention, the internal circuits are electrically connected to each other by the internal bonding pads and the bonding wire, and an electrostatic discharge protection circuit is disposed between the external bonding pad and the internal bonding pad. Thus, the provided integrated circuit device of present invention has a better electrical performance and the capability to avoid the damage from electrostatic discharge.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
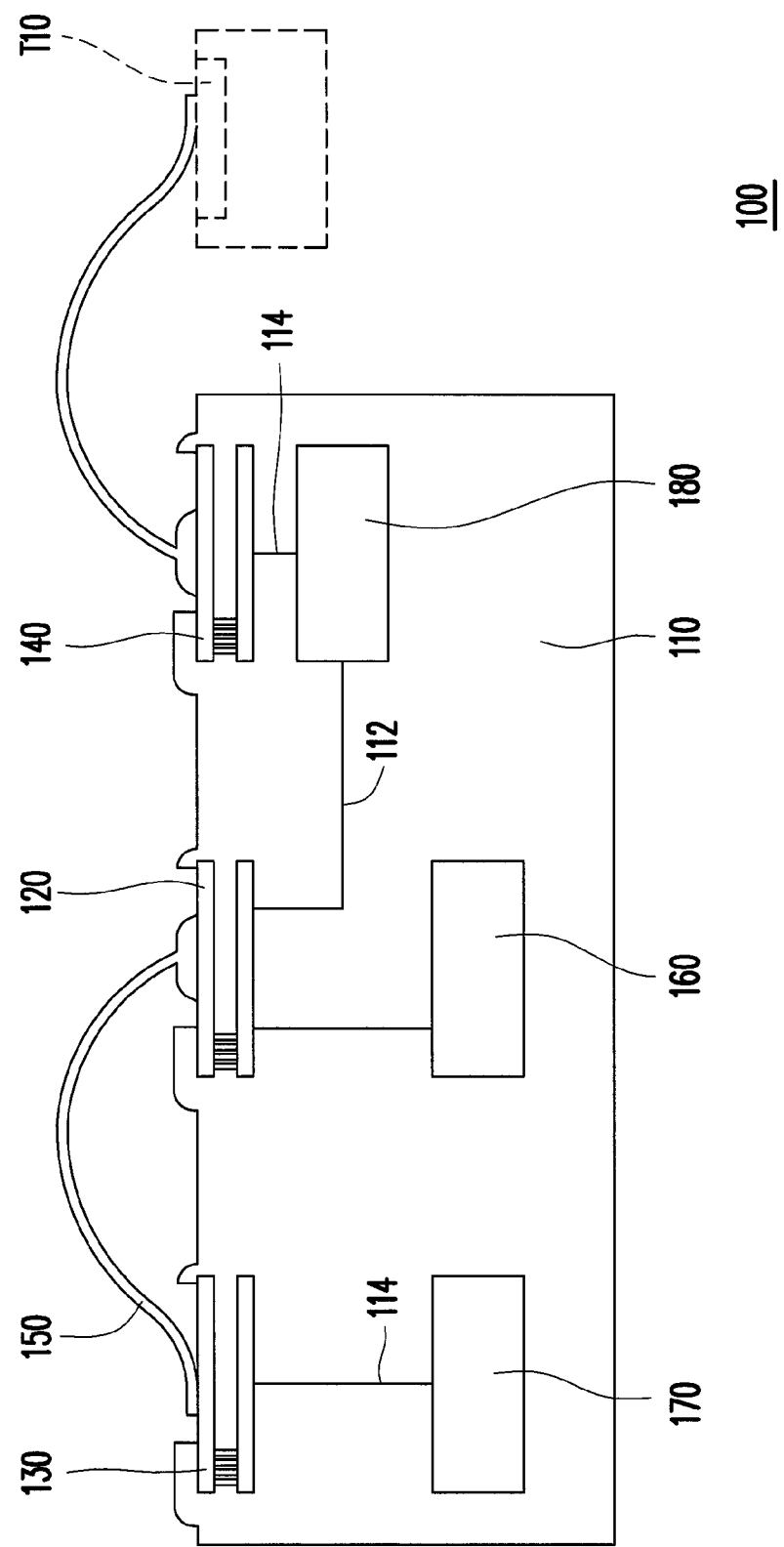
FIG. 1A is a schematic cross-sectional view of an integrated circuit device according to one embodiment of the present invention.
Figure 1B:
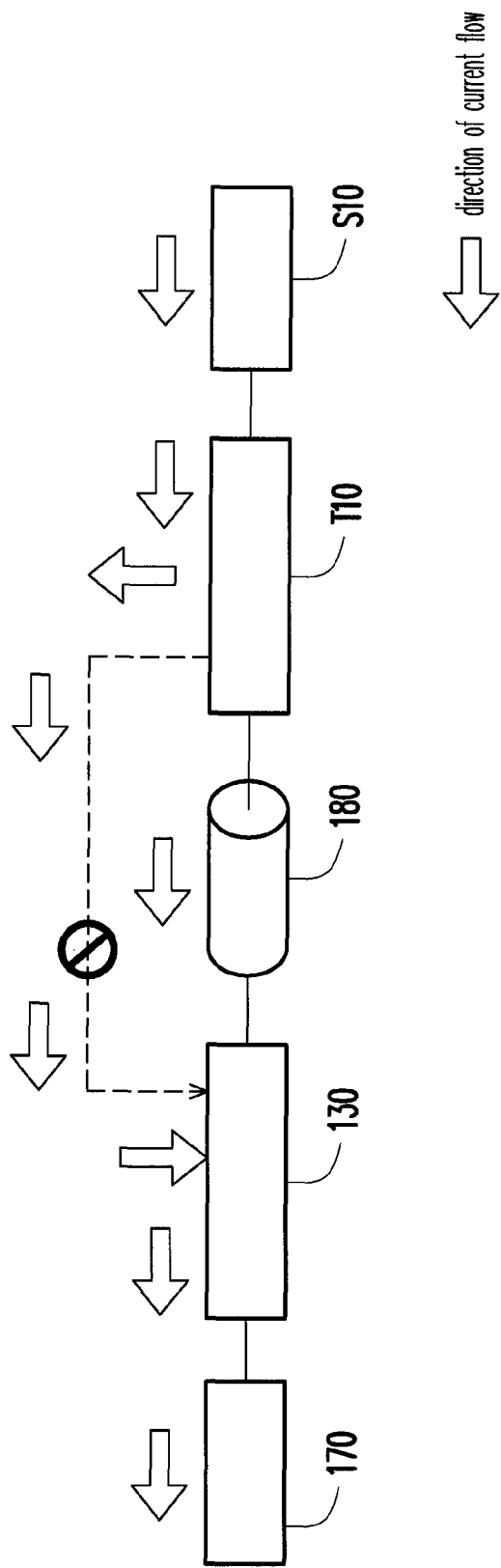
FIG. 1B is a circuit block diagram of the integrated circuit device of FIG. 1A.

FIG. 1A is a schematic cross-sectional view of an integrated circuit device according to one embodiment of the present invention. FIG. 1B is a circuit block diagram of the integrated circuit device of FIG. 1A. Please refer to FIG. 1A. The integrated circuit device 100 of present invention includes a substrate 110, a first internal bonding pad 120, a second internal bonding pad 130, an external bonding pad 140 and a bonding wire 150. A first circuit 160, a second circuit 170, at least one interconnect line 112 and an electrostatic discharge protection circuit 180 are embedded in the substrate 110. In the present embodiment, the substrate 110 may further include a plurality of interconnect lines 114. The first internal bonding pad 120 is disposed on a surface of the substrate 110 and electrically connected to the first circuit 160. The second internal bonding pad 130 is disposed on a surface of the substrate 110 and electrically connected to the second circuit 170. The external bonding pad 140 is disposed on the surface of the substrate 110. The first internal bonding pad 120 is electrically connected to the second internal bonding pad 130 through the bonding wire 150. The first internal bonding pad 120 is electrically connected to the electrostatic discharge protection circuit 180 through the interconnect line 112. The electrostatic discharge protection circuit 180 is electrically connected to the external bonding pad 140. The external bonding pad 140 is used for electrically connecting to an external package lead T10.

In other embodiment, the external bonding pad 140 may also be electrically connected to the first internal bonding pad 120 directly through the interconnect line 112, not through the electrostatic discharge protection circuit 180.

Please refer to FIG. 1A and FIG. 1B. A signal provided by an external system S10 is firstly transmitted to the external package lead T10, and then transmitted to the electrostatic discharge protection circuit 180 from the external package lead T10 through the bonding wire 150, the external bonding pad 140 and the interconnect line 114. Then, the signal is transmitted to the second internal bonding pad 130 from the electrostatic discharge protection circuit 180 through the interconnect line 112, the first internal bonding pad 120 and the bonding wire 150, and then the signal is further transmitted to the second circuit 170 from the second internal bonding pad 130 through the interconnect line 114.

In the integrated circuit device 100 of the embodiment, the first circuit 160 and the second circuit 170 located within the substrate 110 not only can use the path of the interconnect line for signal transmission, but also can use the paths of the first internal bonding pad 120, the bonding wire 150 and the second internal bonding pad 130 for signal transmission. The bonding wire 150 is the metal wire fabricated by the wire bonding process and located outside of the substrate 110. The diameter of the bonding wire 150 is greater than the width of the interconnect line. Hence, the resistance of the bonding wire 150 is comparatively smaller and can obtain a better electrical performance. In addition, by using the bonding wire 150 for signal transmission between the first circuit 160 and the second circuit 170, the inconvenience of necessary to avoid contacting the various circuit within the substrate 110 due to the using of the interconnect line for signal transmission can be avoided. Since the forming of the required number of metal layers can be reduced, the required number of masks to form the interconnect line can be also minimized. Thus, the required time for designing the integrated circuit device 100 is quite substantially decreased.

In the integrated circuit device 100 of the embodiment, the electrostatic discharge protection circuit 180 exists between the external bonding pad 140 and the first internal bonding pad 120. The electrostatic discharge protection circuit 180 can avoid the damage of the first circuit 160 and the second circuit 170 due to the electrostatic discharge from the external package lead T10 and the external bonding pad 140.

For instance, the first circuit 160 of the embodiment can be a logic circuit, a digital circuit, a memory circuit or other circuit. The second circuit 170 can also be a logic circuit, a digital circuit, a memory circuit or other circuit.

Figure 2:
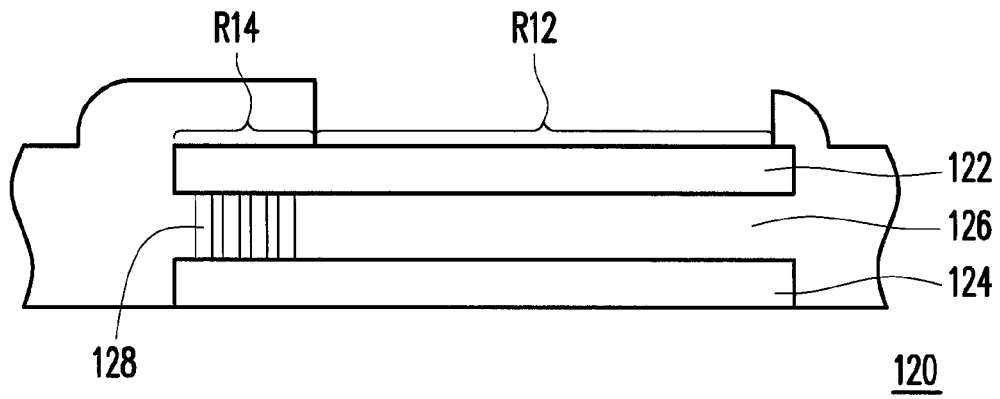
FIG. 2 is a schematic cross-sectional view of the first internal bonding pad of FIG. 1A.
Figure 3:
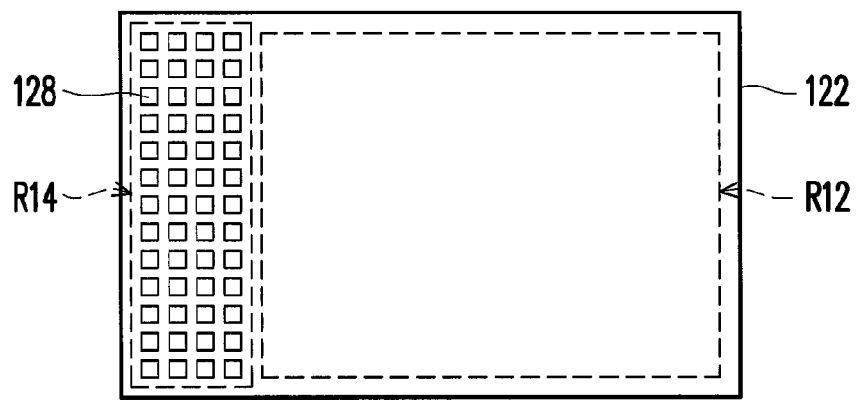
FIG. 3 and FIG. 4 are front views of two metal pads of FIG. 2, respectively.
Figure 4:
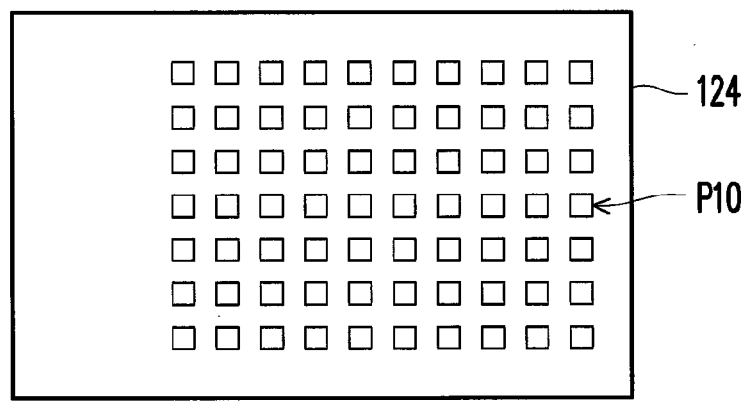

FIG. 2 is a schematic cross-sectional view of the first internal bonding pad of FIG. 1A and FIG. 3 and FIG. 4 are front views of two metal pads of FIG. 2, respectively. Please refer to FIG. 2. In this embodiment, the first internal bonding pad 120 includes a first metal pad 122, a second metal pad 124 and a dielectric layer 126. The first metal pad is electrically connected to the second metal pad 124. The dielectric layer 126 is located between the first metal pad 122 and the second metal pad 124. Since a double metal pad layers structure is used to form the first internal bonding pad 120, the impact of wire bonding which may affect the structure below the first internal bonding pad 120 can be reduced during the wire bonding process. Thus, a circuit can be configured below the first internal bonding pad 120 and it is helpful to minimize the volume of the whole integrated circuit device.

Referring FIG. 2 and FIG. 3, the first metal pad 122 has wire bonding area R12 and a conductive area R14, for example. The first internal bonding pad 120 further includes a plurality of conductive elements 128 passing through the dielectric layer 126 and connecting the conductive area R14 of the first metal pad 122 to the second metal pad 124. The conductive area R14 is located at a side of the wire bonding area R12. The wire bonding area R12 is to sustain the impact during the follow-up wire bonding process. The design of the conductive element 128 not being configured in the wire bonding area R12 can improve the impact endurance of the first internal bonding pad 120. Referring FIG. 2 and FIG. 4, the second metal pad 124 has a plurality of openings P10 (merely shown in FIG. 4), located below the wire bonding area R12. The opening P10 can also improve the impact endurance of the first internal bonding pad 120. Additionally, the wire bonding area R12 of the first metal bonding pad 122 maintains the completeness and the largest contact area with the bonding wire to improve the electrical performance. According to the above mentioned configuration, the first internal bonding pad 120 may have elasticity and can reduce the stress effect exerting on the first internal bonding pad 120 during the wire bonding process, so as to configure a circuit below the first internal bonding pad 120. Referring to FIG. 2, the material of the first metal pad 122 and the second metal pad 124 is copper, for example. Or the material of the first metal pad 122 is aluminum and the material of the second metal pad 124 is copper, for example.

Figure 5:
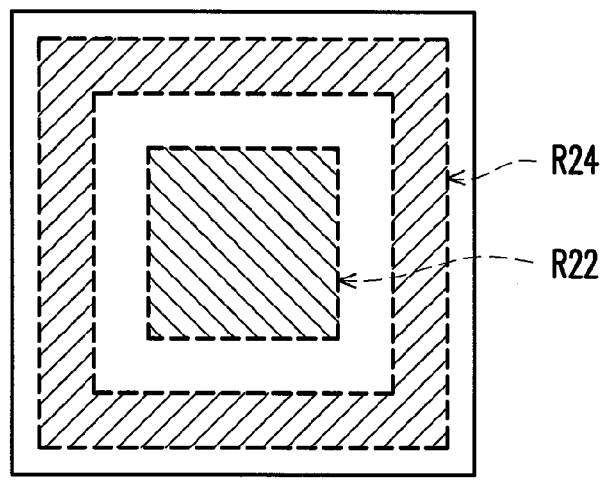
FIG. 5 is a front view of a first metal pad of a first internal bonding pad according to another embodiment.

FIG. 5 is a front view of a first metal pad of a first internal bonding pad according to another embodiment. Referring FIG. 5, in the embodiment, the conductive area R24 of the first metal pad 122 surrounds the wire bonding area R22. Certainly, the corresponding locations of the conductive area R24 and the wire bonding area R22 can also be in other suitable configurations.

Please refer to FIG. 1A. The second internal bonding pad 130 and the external bonding pad 140 can also use the structure similar to the first internal bonding pad 120. That is, in order to improve the impact endurance of the first internal bonding pad 120, they can be configured by the double layers of the metal pads and the dielectric layer between thereof.

Figure 6:
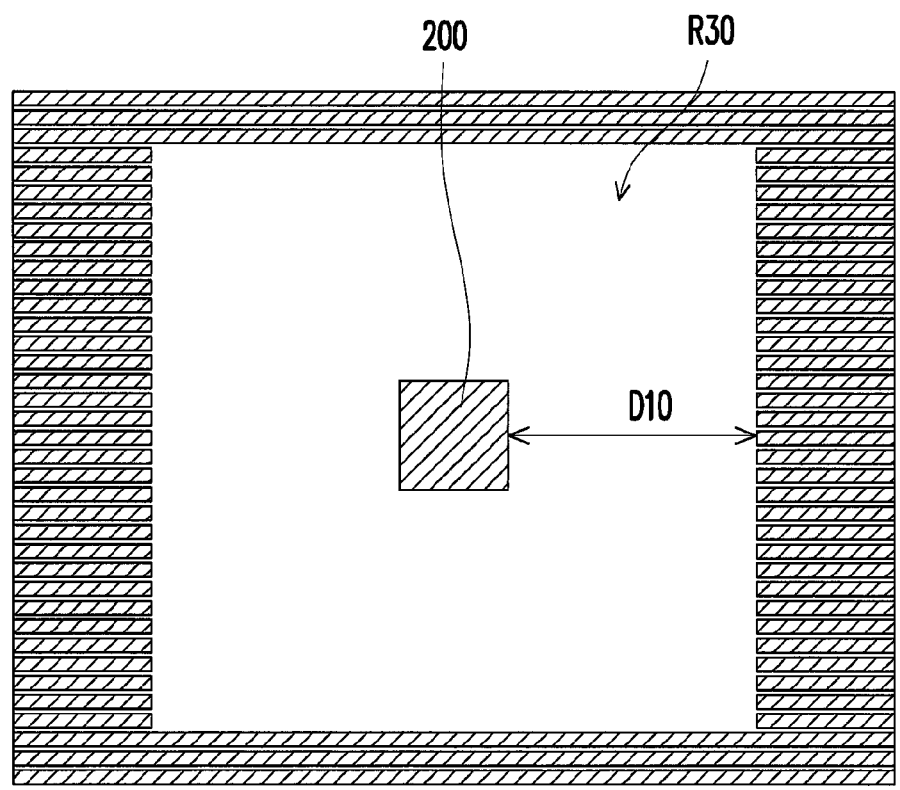
FIG. 6 illustrates a portion of the surface of the substrate of another embodiment of the present invention.

FIG. 6 illustrates a portion of the surface of the substrate of another embodiment of the present invention. Referring FIG. 6, in the embodiment, the surface of the substrate has a non-circuit area R30 surrounding the external bonding pad 200. The distance D10 between the external periphery of the non-circuit area R30 and the external periphery of the external bonding pad 200 is 2 μm to 50 μm. The preferable distance D10 between the external periphery of the non-circuit area R30 and the external periphery of the external bonding pad 200 is 10 μm. The non-circuit area R30 can avoid the damage of the circuit wire due to the impact during the wire bonding process. Similarly, a non-circuit area can also be disposed at the external periphery of the internal bonding pad of the foregoing embodiment.

Figure 7:
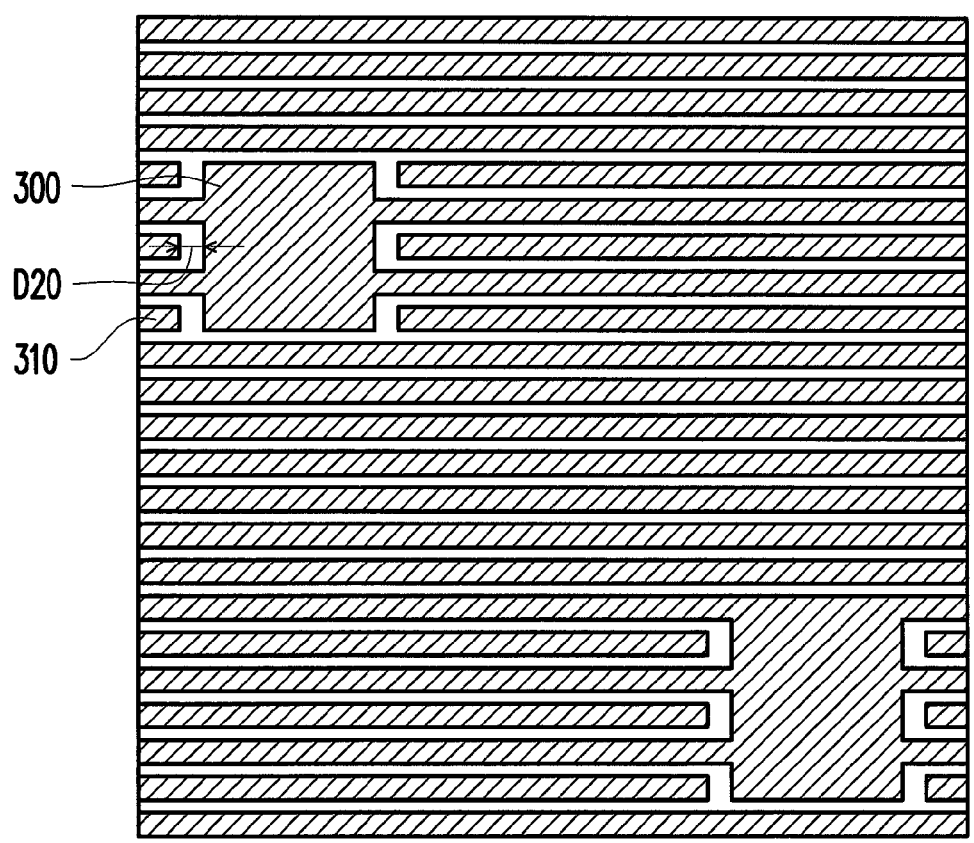
FIG. 7 illustrates an external bonding pad and the configuration of a peripheral circuit thereof according to the first embodiment of the present invention.

FIG. 7 illustrates an external bonding pad and the configuration of a peripheral circuit thereof according to the first embodiment of the present invention. Please refer to FIG. 6 and FIG. 7. FIG. 6 is described with the case of the external bonding pad 200 located at the outer most surface of the substrate. However, the external bonding pad can also use the configuration of the double layers of metal pads as described in FIG. 2 of the embodiment. When the external bonding pad uses the design of the double layers of metal pads, the correlation between the lower layer metal pad 300 and the surrounding circuit is as shown in FIG. 7. That is, the lower layer metal pad 300 in FIG. 7 is merely equivalent to the second metal pad 124 in FIG. 2, and the upper layer metal pad located upon the lower layer metal pad 300 is equivalent to the first metal pad 122 in FIG. 2. However, the main point of FIG. 7 is to illustrate the correlation between the lower layer metal pad 300 and the other circuit of the same layer, and hence the upper layer metal pad is not shown hereby. A transversely and longitudinally interlacing metal mesh 310 is usually formed at the metal layer in which the lower layer metal pad 300 exists. Ground mesh or power mesh is commonly seen. When these meshes meet the lower layer metal pad 300, they should be cut off and keep a distance D20 with the lower layer metal pad 300 unless they have to connect with the lower layer metal pad 300. The distance D20 is between 0.5 μm to 10 μm, and the preferable distance D20 is 2 μm.

In light of the foregoing, in the integrated circuit device of present invention, the internal bonding pad and bonding wire are used to obtain electrical connection between the internal circuits. The wire bonding can provide a better electrical performance. Moreover, less design restriction can be obtained and the time of design can also be reduced. Furthermore, the cost is decreased since the number of metal layers for forming the interconnect lines can be reduced. In addition, in the integrated circuit device of present invention, since the electrostatic discharge protection circuit exists between the external bonding pad and the first internal bonding pad, the damage of the internal circuit due to electrostatic discharge can be avoided.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An integrated circuit device, comprising:
   a substrate, wherein a first circuit, a second circuit, at least one interconnect line and an electrostatic discharge protection circuit are embedded in the substrate;
   a first internal bonding pad, disposed on a surface of the substrate and exposed outside of the substrate, and the first internal bonding pad being electrically connected to the first circuit;
   a second internal bonding pad, disposed on the surface of the substrate and exposed outside of the substrate, and the second internal bonding pad being electrically connected to the second circuit;
   an external bonding pad, disposed on the surface of the substrate and exposed outside of the substrate; and
   a bonding wire, wherein the first internal bonding pad is electrically connected to the second internal bonding pad via the bonding wire, the first internal bonding pad is electrically connected to the electrostatic discharge protection circuit via the interconnect line, the electrostatic discharge protection circuit is electrically connected to the external bonding pad, and the external bonding pad is used for electrically connecting to an external package lead.

2. The integrated circuit device as claimed in claim 1, wherein the first circuit is a logic circuit, a digital circuit or a memory circuit.

3. The integrated circuit device as claimed in claim 1, wherein the second circuit is a logic circuit, a digital circuit or a memory circuit.

4. The integrated circuit device as claimed in claim 1, wherein the first internal bonding pad comprises a first metal pad, a second metal pad and a dielectric layer, the first metal pad is electrically connected to the second metal pad, the dielectric layer is located between the first metal pad and the second metal pad.

5. The integrated circuit device as claimed in claim 4, wherein the first metal pad has a wire bonding area and a conductive area, the first internal bonding pad further comprises a plurality of conductive elements passing through the dielectric layer and connecting the conductive area to the second metal pad.

6. The integrated circuit device as claimed in claim 5, wherein the conductive area is located at a side of the wire bonding area.

7. The integrated circuit device as claimed in claim 5, wherein the conductive area surrounds the wire bonding area.

8. The integrated circuit device as claimed in claim 5, wherein the second metal pad has a plurality of openings located below the wire bonding area.

9. The integrated circuit device as claimed in claim 4, wherein the material of the first metal pad and the second metal pad is copper.

10. The integrated circuit device as claimed in claim 4, wherein the material of the first metal pad is aluminum, and the material of the second metal pad is copper.

11. The integrated circuit device as claimed in claim 1, wherein the second internal bonding pad comprises a first metal pad, a second metal pad and a dielectric layer, the first metal pad is electrically connected to the second metal pad, the dielectric layer is located between the first metal pad and the second metal pad.

12. The integrated circuit device as claimed in claim 1, wherein the external bonding pad comprises a first metal pad, a second metal pad and a dielectric layer, the first metal pad is electrically connected to the second metal pad, the dielectric layer is located between the first metal pad and the second metal pad.

13. The integrated circuit device as claimed in claim 1, wherein the surface of the substrate has a non-circuit area surrounding the external bonding pad, the distance between the external periphery of the non-circuit area and the external periphery of the external bonding pad is 2 μm 50 μm.

14. The integrated circuit device as claimed in claim 13, wherein the distance between the external periphery of the non-circuit area and the external periphery of the external bonding pad is 10 μm.

* * * * *